(12) United States Patent
Glass et al.

(10) Patent No.: US 9,997,414 B2
(45) Date of Patent: Jun. 12, 2018

(54) GE/SIGE-CHANNEL AND III-V-CHANNEL TRANSISTORS ON THE SAME DIE

(71) Applicant: INTEL CORPORATION, Santa Clara, CA (US)

(72) Inventors: Glenn A. Glass, Portland, OR (US); Anand S. Murthy, Portland, OR (US); Karthik Jambunathan, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days. days.

(21) Appl. No.: 15/125,437

(22) PCT Filed: Jun. 24, 2014

(86) PCT No.: PCT/US2014/043821
§ 371 (c)(1),
(2) Date: Sep. 12, 2016

(87) PCT Pub. No.: WO2015/199655
PCT Pub. Date: Dec. 30, 2015

(65) Prior Publication Data
US 2017/0162447 A1    Jun. 8, 2017

(51) Int. Cl.
*H01L 21/00* (2006.01)
*H01L 27/00* (2006.01)
(Continued)

(52) U.S. Cl.
CPC ............. *H01L 21/823807* (2013.01); *H01L 21/02532* (2013.01); *H01L 21/02543* (2013.01);
(Continued)

(58) Field of Classification Search
CPC ....... H01L 21/823807; H01L 21/02532; H01L 21/02543; H01L 21/02546;
(Continued)

(56) References Cited

U.S. PATENT DOCUMENTS

| 7,083,998 B2 * | 8/2006 | Chu | B82Y 20/00 257/E27.128 |
| 8,134,197 B2 * | 3/2012 | Forbes | B82Y 10/00 257/314 |

(Continued)

FOREIGN PATENT DOCUMENTS

| EP | 1089338 A2 | 4/2001 |
| EP | 2897161 A1 | 7/2015 |

(Continued)

OTHER PUBLICATIONS

International Search Report and Written Opinion as received for Patent Application No. PCT/US2014/043821, dated Mar. 26, 2015, 10 pages.

(Continued)

*Primary Examiner* — Nikolay Yushin
(74) *Attorney, Agent, or Firm* — Finch & Maloney PLLC

(57) ABSTRACT

Techniques are disclosed for forming Ge/SiGe-channel and III-V-channel transistors on the same die. The techniques include depositing a pseudo-substrate of Ge/SiGe or III-V material on a Si or insulator substrate. The pseudo-substrate can then be patterned into fins and a subset of the fins can be replaced by the other of Ge/SiGe or III-V material. The Ge/SiGe fins can be used for p-MOS transistors and the III-V material fins can be used for n-MOS transistors, and both sets of fins can be used for CMOS devices, for example. In some instances, only the channel region of the subset of fins are replaced during, for example, a replacement gate process. In some instances, some or all of the fins may be (Continued)

formed into or replaced by one or more nanowires or nanoribbons.

25 Claims, 12 Drawing Sheets

(51) Int. Cl.

| | | |
|---|---|---|
| *H01L 29/00* | (2006.01) | |
| *H01L 21/8238* | (2006.01) | |
| *H01L 21/84* | (2006.01) | |
| *H01L 29/66* | (2006.01) | |
| *H01L 27/092* | (2006.01) | |
| *H01L 29/786* | (2006.01) | |
| *H01L 27/12* | (2006.01) | |
| *H01L 29/10* | (2006.01) | |
| *H01L 21/02* | (2006.01) | |
| *H01L 29/06* | (2006.01) | |
| *H01L 29/165* | (2006.01) | |
| *H01L 29/205* | (2006.01) | |
| *H01L 29/423* | (2006.01) | |

(52) U.S. Cl.
CPC .. *H01L 21/02546* (2013.01); *H01L 21/02603* (2013.01); *H01L 21/823821* (2013.01); *H01L 21/845* (2013.01); *H01L 27/0922* (2013.01); *H01L 27/0924* (2013.01); *H01L 27/1211* (2013.01); *H01L 29/0673* (2013.01); *H01L 29/1054* (2013.01); *H01L 29/165* (2013.01); *H01L 29/205* (2013.01); *H01L 29/42392* (2013.01); *H01L 29/66545* (2013.01); *H01L 29/78681* (2013.01); *H01L 29/78684* (2013.01); *H01L 29/78696* (2013.01)

(58) Field of Classification Search
CPC ....... H01L 21/02603; H01L 21/823821; H01L 21/845; H01L 27/0922; H01L 27/0924; H01L 27/1211; H01L 29/0673; H01L 29/1054; H01L 29/165; H01L 29/205; H01L 29/42392; H01L 29/78681; H01L 29/78684; H01L 29/78696
See application file for complete search history.

(56) References Cited

U.S. PATENT DOCUMENTS

| | | | |
|---|---|---|---|
| 9,646,891 B2* | 5/2017 | Yang | ............... H01L 21/823828 |
| 2005/0023554 A1* | 2/2005 | Chu | ..................... B82Y 20/00 |
| | | | 257/190 |
| 2007/0090406 A1* | 4/2007 | Zhu | ................... H01L 21/26506 |
| | | | 257/213 |
| 2008/0169485 A1* | 7/2008 | Heyns | .................. H01L 29/267 |
| | | | 257/194 |
| 2008/0169512 A1 | 7/2008 | Doyle et al. | |
| 2009/0072276 A1 | 3/2009 | Inaba | |
| 2010/0055881 A1 | 3/2010 | Shimizu | |
| 2011/0049613 A1 | 3/2011 | Yeh et al. | |
| 2013/0153964 A1 | 6/2013 | Guo et al. | |
| 2013/0161694 A1 | 6/2013 | Adam et al. | |
| 2013/0161756 A1 | 6/2013 | Glass et al. | |
| 2014/0027860 A1 | 1/2014 | Glass et al. | |
| 2014/0091360 A1 | 4/2014 | Pillariselly et al. | |
| 2015/0228730 A1* | 8/2015 | Yang | .................... H01L 27/092 |
| | | | 257/369 |

FOREIGN PATENT DOCUMENTS

| | | |
|---|---|---|
| JP | H04174560 A | 6/1992 |
| JP | 2001093987 A | 4/2001 |
| JP | 2007258485 A | 10/2007 |
| JP | 2010177451 A | 8/2010 |
| JP | 2010278435 A | 12/2010 |
| JP | 2013016789 A | 1/2013 |
| JP | 2014063929 A | 4/2014 |
| WO | 2015199655 A1 | 12/2015 |

OTHER PUBLICATIONS

Taiwan Office Action (including TW Search Report and English Translation) received for TW Application No. 104115776, dated Apr. 13, 2016. 6 pages.
International Preliminary Report on Patentability as received for Patent Application No. PCT/US2014/043821, dated Dec. 27, 2016. 6 pages.
Notification of Reasons for Refusal issued for JP Application No. 2016-566283, dated Mar. 27, 2018. 7 pages.
Extended European Search Report received for EP Application No. 14895739.2 dated Jan. 5, 2018. 11 pages.

* cited by examiner

GE/SIGE-CHANNEL AND III-V-CHANNEL TRANSISTORS ON THE SAME DIE

BACKGROUND

Increased performance and yield of circuit devices on a substrate, including transistors, diodes, resistors, capacitors, and other passive and active electronic devices formed on a semiconductor substrate, are typically a major factor considered during design, manufacture, and operation of those devices. For example, during design and manufacture or forming of metal-oxide-semiconductor (MOS) transistor semiconductor devices, such as those used in complementary metal-oxide-semiconductor (CMOS) devices, it is often desired to increase movement of electrons (carriers) in n-type MOS device (n-MOS) channels and to increase movement of positive charged holes (carriers) in p-type MOS device (p-MOS) channels.

DETAILED DESCRIPTION

Figure 1:
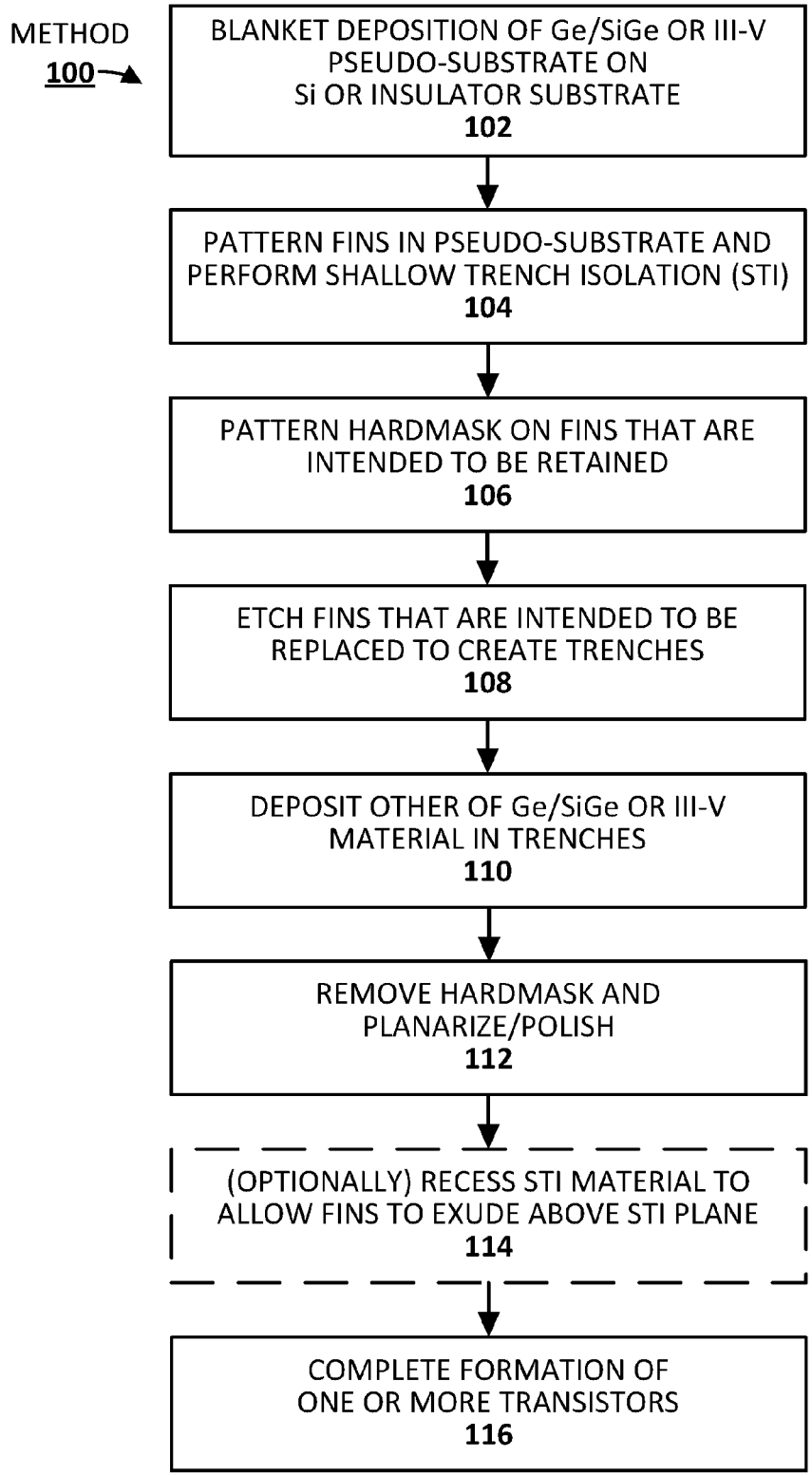
FIG. 1 illustrates a method of forming an integrated circuit, in accordance with one or more embodiments of the present disclosure.

Techniques are disclosed for forming Ge/SiGe-channel and III-V-channel transistors on the same die. The techniques include depositing a pseudo-substrate of Ge/SiGe or III-V material on a Si or insulator substrate. The pseudo-substrate can then be patterned into fins and a subset of the fins can be replaced by the other of Ge/SiGe or III-V material. The Ge/SiGe fins can be used for p-MOS transistors and the III-V material fins can be used for n-MOS transistors, and both sets of fins can be used for CMOS devices. In some instances, only the channel regions of the subset of fins are replaced during, for example, a replacement gate process. In some instances, some or all of the fins may be formed into or replaced by one or more nanowires or nanoribbons. Numerous configurations and variations will be apparent in light of this disclosure.

General Overview

It may be desirable in some applications to form transistors with germanium (Ge) or silicon germanium (SiGe) channels (e.g., for p-MOS devices) and transistors with III-V material channels (e.g., for n-MOS devices). The formation of structures and devices including both Ge/SiGe-channel and III-V-channel transistor devices, such as CMOS devices, involves non-trivial challenges that can affect, for example, performance and yield. While silicon (Si) is a relatively common, inexpensive, and abundant wafer material, it may not adequately support both Ge/SiGe-channel and III-V-channel transistor devices built directly upon it. For example, issues such as degradation in electrical carrier mobility, interface trap density, and potential for dopant to migrate/segregate into dislocations (and potentially thereby cause gross shorting) can arise due to the significant defect densities caused when depositing both Ge/SiGe and III-V materials directly on a Si substrate.

Thus, and in accordance with one or more embodiments of the present disclosure, techniques are disclosed for forming both Ge/SiGe-channel and III-V-channel transistors on the same die. In some embodiments, the techniques include an initial blanket deposition of a Ge/SiGe or III-V pseudo-substrate on a Si substrate, followed by forming the other of Ge/SiGe or III-V material in the pseudo-substrate. For example, if Ge or SiGe is blanket deposited on a Si substrate (to form p-MOS devices, for example), then the Ge/SiGe pseudo-substrate can be used as a substrate for the deposition of the III-V material (to form n-MOS devices, for example). In another example, if III-V material is blanket deposited on a Si substrate (to form n-MOS devices, for example), the III-V layer can then be used as a pseudo-substrate for the deposition of the Ge/SiGe material (to form p-MOS devices, for example). By performing the initial deposition of one of the Ge/SiGe or III-V materials in blanket form on the Si substrate, a higher quality deposition can be achieved (as compared to, for example, non-blanket depositions of the materials, such as fabricating only fin structures or channel regions of the materials on the Si substrate). The blanket deposition also provides greater flexibility in performing etches and thermal treatments on the pseudo-substrate as compared to performing the same on, for example, patterned Si wafers. In addition, it can be advantageous (e.g., from at least a compatibility standpoint) to deposit Ge/SiGe on III-V materials and to deposit III-V materials on Ge/SiGe, as compared to depositing Ge/SiGe or III-V materials on Si.

In other embodiments, the initial blanket deposition of the Ge/SiGe or III-V materials can be performed on an insulator substrate as opposed to a Si substrate, to form a Ge-on-insulator (GOI), SiGe-on-insulator (SGOI), or III-V material-on-insulator (e.g., GaAsOI) structure, for example. In such embodiments, the other of the Ge/SiGe or III-V materials can then be deposited on the formed structure to, for example, integrate both p-MOS and n-MOS devices on the same die. As will be apparent in light of the present disclosure, the techniques disclosed herein may be used to form planar, finned, and/or nanowire transistor configurations. In some embodiments, a combination of different transistor configurations may be used on the same die or integrated circuit, using the techniques described herein. For example, in an embodiment, a CMOS device may be formed including a Ge/SiGe-channel p-MOS device and a III-V-channel n-MOS device, where one of the p-MOS or n-MOS devices has a finned configuration and the other has a nanowire configuration, as will be discussed in more detail herein. Blanket deposition, as variously used herein, includes a deposition or growth of material (e.g., pseudo-substrate material) where the deposited/grown material covers a substantial portion of a substrate area where multiple transistors will be formed using the techniques described herein. In some cases, the blanket deposition may cover the entirety of the wafer or die or other suitably sized substrate, while in other cases, the blanket deposition may only cover the areas of the wafer/die/substrate where transistors will be formed.

In some embodiments, the Ge/SiGe material (whether blanket deposited on a Si or insulator substrate, or deposited on a III-V pseudo-substrate) may comprise Ge and/or $Si_{1-x}Ge_x$ (e.g., where x>0.8 or 0.4>x>0.2). In some embodiments, the III-V layer (whether blanket deposited on a Si or insulator substrate, or deposited on a Ge/SiGe pseudo-substrate) may comprise a single III-V material or a stack of III-V materials. For example, in some embodiments, the III-V layer may comprise a single layer of gallium arsenide (GaAs) or indium phosphide (InP), or a multilayer stack of III-V materials, such as InP/InGaAs/InAs. Numerous other Ge/SiGe and III-V material configurations will be apparent in light of this disclosure. The Ge/SiGe and III-V materials, as variously discussed herein, may be strained and/or include doping depending on the end use or target application. In some embodiments, the III-V material (whether a single layer or a multilayer stack) may include p-type doping near the bottom and n-type doping near the top to, for example, create a built-in diode that stops or impedes leakage current flow to the substrate/layer the III-V material is deposited on.

In some embodiments, after the Ge/SiGe or III-V pseudo-substrate is formed (e.g., via blanket deposition on a Si or insulator layer), fins are formed in the substrate and shallow trench isolation is performed. A subset of fins desired to be replaced can then be etched out and replaced by depositing the other of the Ge/SiGe or III-V materials. In some embodiments, the replacement may be performed for a substantial portion or the entirety of each fin within that subset. However, in other embodiments, only the channel regions of the subset may be replaced during, for example, replacement metal gate (RMG) processing. In some such embodiments, the source and drain regions of the subset of fins (that had the channel regions replaced) may be maintained as the original Ge/SiGe or III-V substrate material.

Upon analysis (e.g., using scanning/transmission electron microscopy (SEM/TEM) and/or composition mapping), a structure or device configured in accordance with one or more embodiments will effectively show a die including a Si or insulator substrate including both a Ge/SiGe-channel device (e.g., a p-MOS device) and a III-V-channel device (e.g., an n-MOS device), where one of the materials is deposited on the other (e.g., Ge/SiGe deposited on a III-V material pseudo-substrate or III-V material deposited on a Ge/SiGe pseudo-substrate). In some cases, the device may be a CMOS device including both a Ge/SiGe-channel device (e.g., a p-MOS device) and a III-V channel device (e.g., an n-MOS device). In some embodiments, performance benefits may be realized from the blanket deposition of the Ge/SiGe or III-V pseudo-substrate on a Si or insulator substrate, as compared to, for example, depositing the Ge/SiGe or III-V material selectively (e.g., to form only fins of such material). Performance benefits may also be realized from depositing Ge/SiGe on a III-V pseudo-substrate or depositing III-V material on a Ge/SiGe pseudo-substrate (e.g., when replacing a subset of the pseudo-substrate fins), as compared to depositing the Ge/SiGe or III-V materials on a Si substrate. Such performance benefits may include improved electrical carrier mobility, improved interface trap density, and a reduction or elimination of the potential for dopant to migrate/segregate into dislocations (and potentially thereby cause gross shorting). Numerous configurations and variations will be apparent in light of this disclosure.

Architecture and Methodology

FIG. 1 illustrates a method 100 of forming an integrated circuit, in accordance with one or more embodiments of the present disclosure. FIGS. 2A-H illustrate example structures that are formed when carrying out method 100 of FIG. 1, in accordance with various embodiments. Although the structures of FIGS. 2A-H are primarily depicted and described herein in the context of forming finned transistor configurations (e.g., tri-gate or finFET), the present disclosure need not be so limited. For example the techniques can be used to form planar, dual-gate, finned, and/or nanowire (or gate-all-around or nanoribbon) transistor configurations, or other suitable configurations, as will be apparent in light of this disclosure. FIGS. 3A-B, 4A-B, and 5A-B illustrate integrated circuits including various transistor configurations formed using the techniques described herein, in accordance with some embodiments.

Figure 2A:
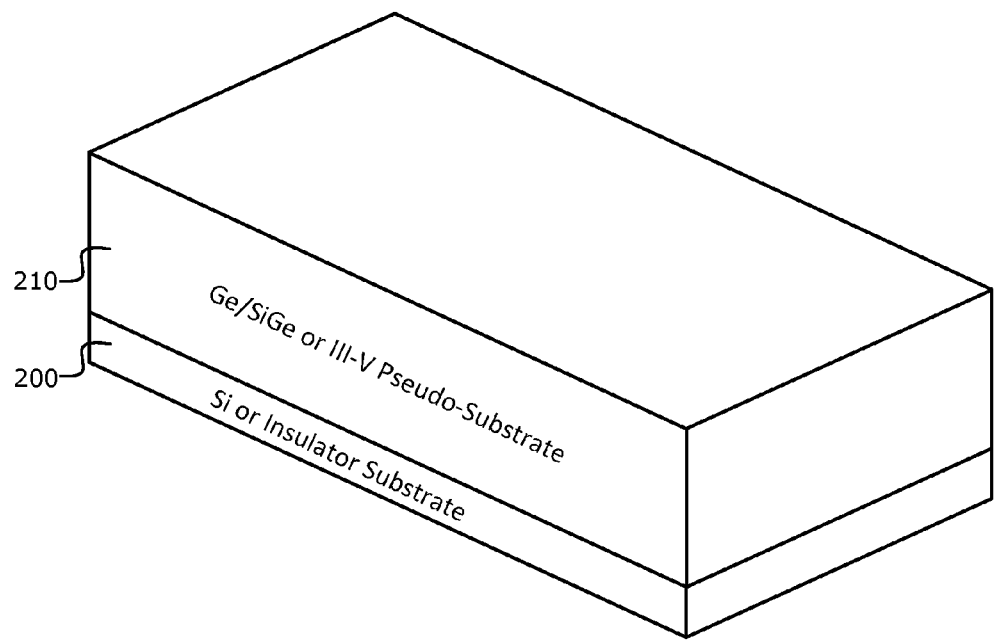
FIGS. 2A-H illustrate example structures that are formed when carrying out the method of FIG. 1, in accordance with various embodiments.

As can be seen in FIG. 1, method 100 includes performing 102 a blanket deposition of a Ge/SiGe or III-V pseudo-substrate 210 on a Si or insulator substrate 200 to form the example resulting structure shown in FIG. 2A, in accordance with an embodiment. Substrate 200 may include a Si bulk substrate, a Si on insulator (SOI) structure, or some other suitable multilayer structure where the top layer is Si and can be used as a substrate upon which pseudo-substrate 210 can be deposited. Substrate 200 may also be an insulator, such as an oxide material or dielectric material or some other electrically insulative material, upon which pseudo-substrate 210 is formed. In embodiments where substrate 200 is an insulator, the deposition of pseudo-substrate 210 on insulator 200 can form a Ge-on-insulator (GOI), SiGe-on-insulator (SGOI), or III-V material-on-insulator (e.g., GaAsOI) structure, for example. Blanket deposition 102 may include chemical vapor deposition (CVD), atomic layer deposition (ALD), liquid phase epitaxy (LPE), physical vapor deposition (PVD), molecular beam epitaxy (MBE), or any other suitable process that allows pseudo-substrate 210 to be formed on substrate 200. In some instances, a chemical and/or thermal treatment may be performed ex-situ or in-situ to prepare the surface of substrate 200 for blanket epitaxial deposition 102 of pseudo-substrate 210. Blanket deposition 102 may include a constant deposition of the pseudo-substrate 210 material, or it may include a graded or multilayer deposition (e.g., to reduce the threading dislocation density of pseudo-substrate 210). Blanket depositions 102 may include periodic or post deposition annealing and may include a post deposition polish to recover surface smoothness of pseudo-substrate 210.

Pseudo-substrate 210 may comprise Ge/SiGe or at least one III-V material, as previously described. In some embodiments, where pseudo-substrate 210 comprises Ge/SiGe material, pseudo-substrate 210 may comprise Ge and/or $Si_{1-x}Ge_x$ (e.g., where x>0.8 or 0.4>x>0.2). For example, in some embodiments, pseudo-substrate 210 may comprise a single layer of Ge or SiGe, or a graded or multilayer stack including Ge and/or SiGe (e.g., a multilayer stack including SiGe layers having varying percentages of Ge). In some embodiments, where pseudo-substrate 210 comprises III-V material, pseudo-substrate 210 may comprise a single III-V material or a stack of III-V materials. For example, in some embodiments, pseudo-substrate 210 may comprise a single layer of gallium arsenide (GaAs), indium phosphide (InP), indium arsenide (InAs), indium gallium arsenide (InGaAs), aluminum arsenide (AlAs), or indium aluminum arsenide (InAlAs), or any other suitable III-V material. In other embodiments, pseudo-substrate 210 may comprise a multilayer stack of III-V materials, such as InP/InGaAs/InAs, GaAs/InP/InAs, GaAs/InGaAs/InAs, GaAs/InAlAs/InAs, InP/InGaAs/InP, GaAs/InAs, GaAs/InGaAs, or InP/InGaAs, or any other suitable multilayer stack comprising two or more III-V materials. In such embodiments where pseudo-substrate 210 is a III-V multilayer stack, a high bandgap III-V material may be used near the bottom of the stack (e.g., to help reduce leakage current to ground), such as GaAs, InP, InAlAs, or AlAs, for example. Also, a III-V multilayer stack may employ a low bandgap III-V material near the top of the stack (e.g., to help with making contact to the stack), such as InAs or InGaAs, for example.

The Ge/SiGe and III-V materials, as variously discussed herein, may be strained and/or doped depending on the end use or target application. Doping of a portion of pseudo-substrate 210 may also occur at another stage in method 100, as will be apparent in light of this disclosure. In some embodiments, the III-V material (whether a single layer or a multilayer stack) may include p-type doping near the bottom and n-type doping near the top to, for example, create a built-in diode that stops or impedes leakage current flow to substrate 210.

Figure 2B:
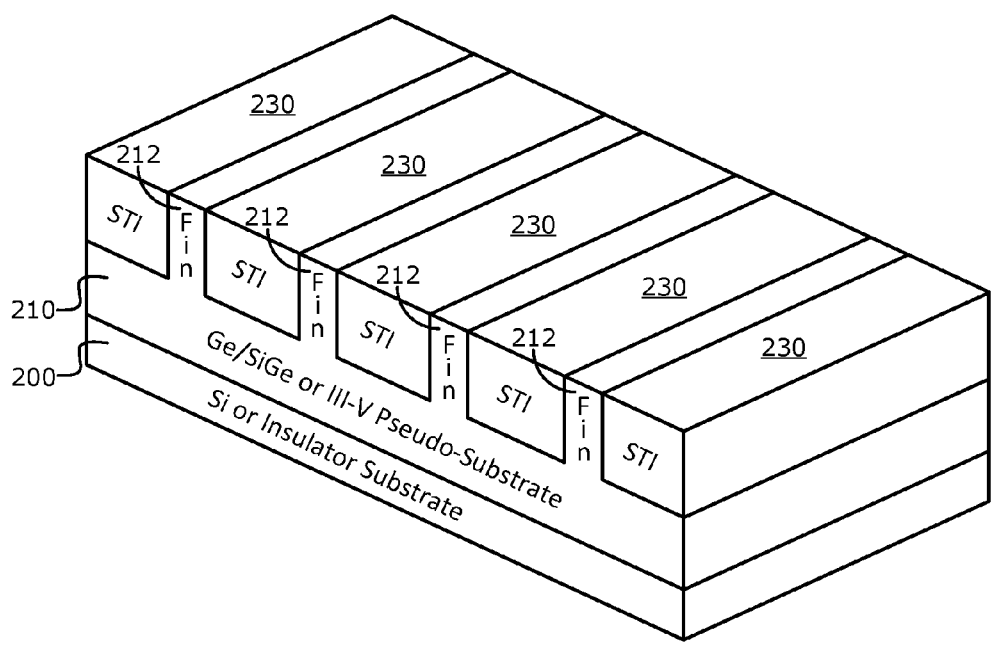

Method 100 continues with patterning 104 fins 212 in pseudo-substrate 210 and performing shallow trench isolation (STI), to form the resulting example structure shown in FIG. 2B, in accordance with an embodiment. Patterning or forming 104 fins 212 may include any number of masking/etching processes, and/or any other suitable techniques. For example, in this example embodiment, an STI trench etch process was performed to form fins 212. After STI trench etch was performed, in this example embodiment, the trenches were filled with STI oxide 230 and the structure was polished flat to form the structure shown in FIG. 2B. Note that, in this example embodiment, fins 212 are formed such that pseudo-substrate material 210 is still present under STI material 230. Also note that although only four fins are shown in this example embodiment, any number of fins 212 of either varying or consistent shapes and sizes may be formed in pseudo-substrate 210, depending upon the end use or target application.

Figure 2C:
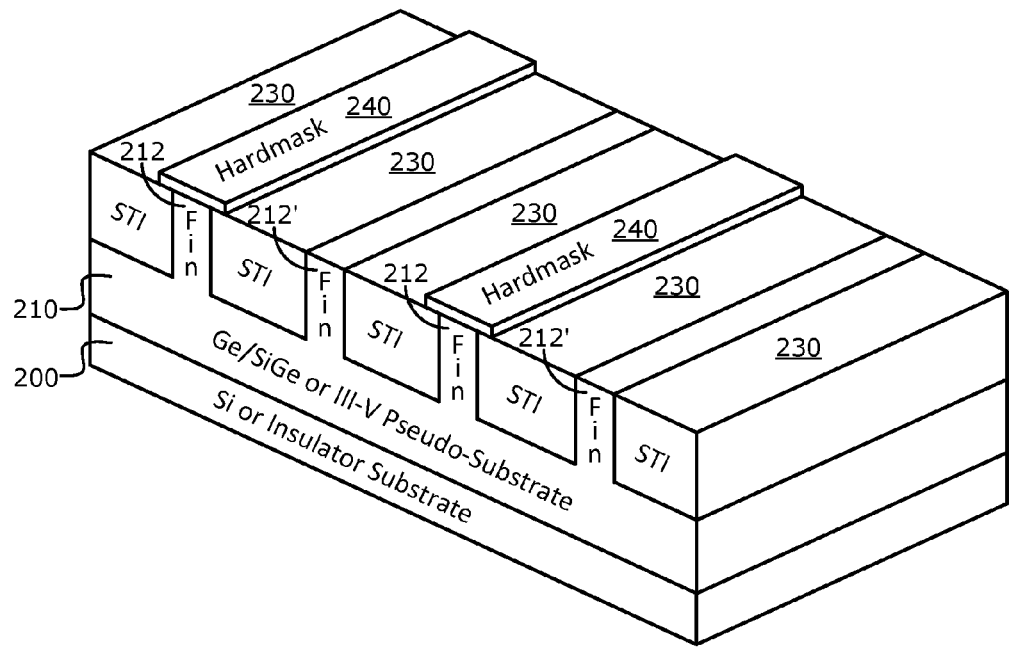

Method 100 continues with patterning 106 hardmask 240 on fins 212 that are intended to be retained/kept, to form the resulting example structure shown in FIG. 2C, in accordance with an embodiment. Patterning 104 may include any number of masking/etching processes, and/or any other suitable techniques. Hardmask 240 may be comprised of any suitable material, such as titanium nitride, for example. Note that in this example embodiment, every other fin 212 has a hardmask 240 patterned on it as can be seen, because those fins are intended to be kept in this example case. However, patterning 106 can be performed such that hardmask 240 is over a different set of fins, depending upon the end use or target application. Also note that the fins that are intended to be replaced, as will be discussed herein, are indicated as 212', in this example embodiment.

Figure 2D:
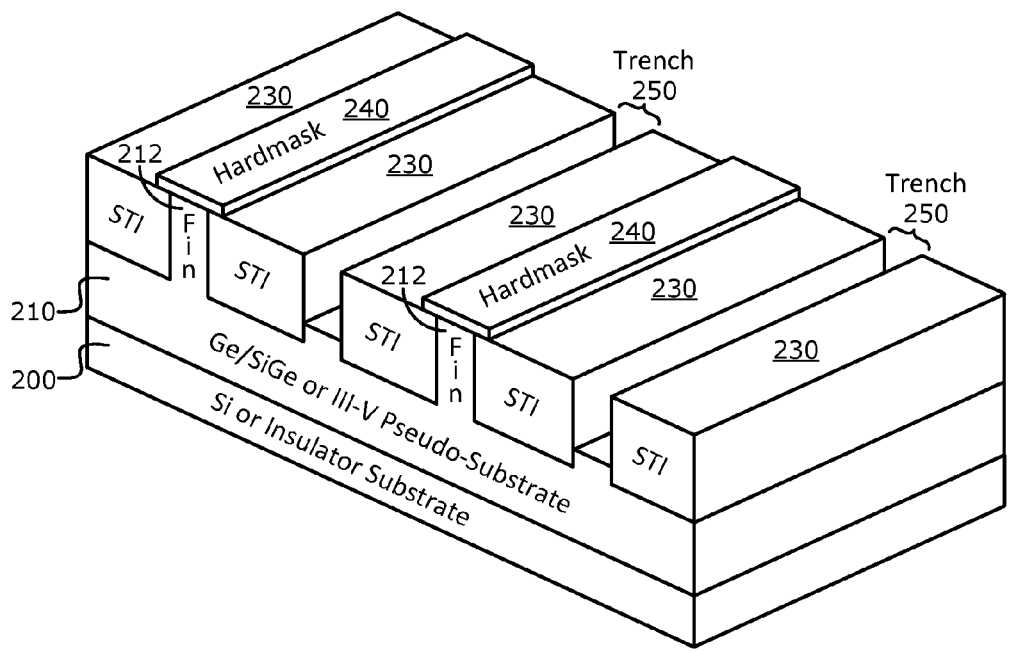

Method 100 continues with etching 108 fins 212' that are intended to be replaced to create trenches 250, as can be seen in the example structure shown in FIG. 2D, in accordance with an embodiment. Etch 108 may be performed using any suitable etching techniques, such as various dry and/or wet etch processes. In some embodiments, etch 108 may be performed in-situ/without air break, while in other embodiments, etch 108 may be performed ex-situ.

Figure 2E:
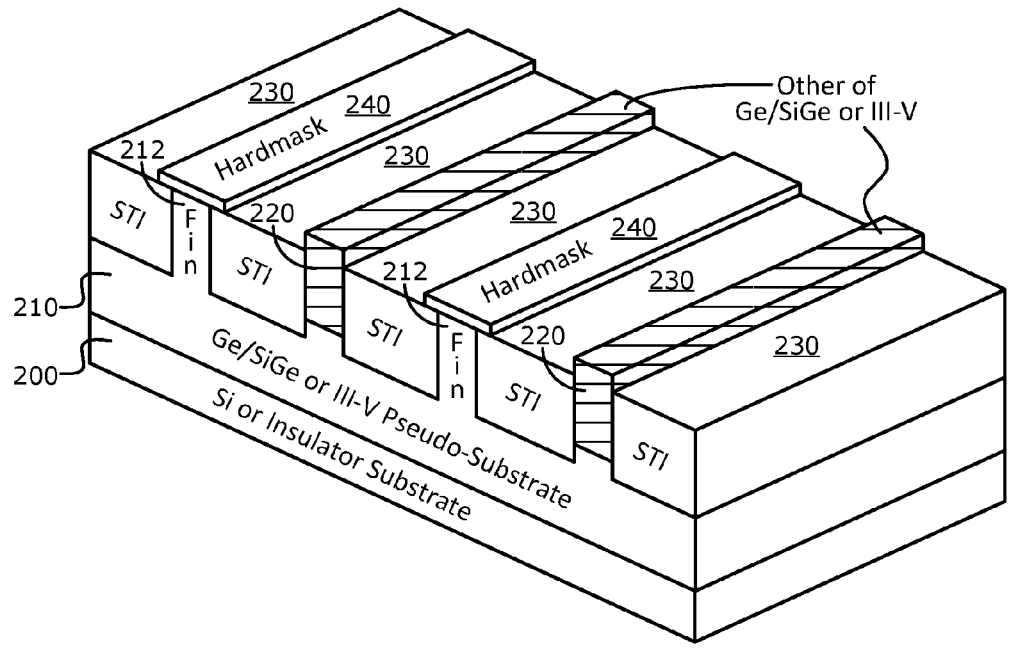

Method 100 continues with depositing 110 the other of Ge/SiGe or III-V material 220 in trenches 250, to form the resulting example structure shown in FIG. 2E, in accordance with an embodiment. Deposition 110 of replacement material 220 may include any deposition process described herein (e.g., CVD, ALD, LPE, PVD, MBE), or any other suitable deposition process. As can be seen in FIG. 2E, deposition 110 is a selective deposition in this example embodiment, such that replacement material 220 is only retained in trenches 250 (and is not retained on STI material 230 or hardmask material 240). Deposition 110 may include a constant deposition of replacement material 220, or it may include a graded or multilayer deposition. In this example embodiment, the replacement deposition material 220 is dependent on the material of the pseudo-substrate 210. For example, if pseudo-substrate 210 comprises Ge/SiGe material, then the replacement material 220 comprises III-V material. In another example, if pseudo-substrate 210 comprises III-V material, then the replacement material 220 comprises Ge/SiGe material. The discussion herein with respect to the Ge/SiGe and III-V materials for pseudo-substrate 210 is equally applicable to replacement material 220. For example, replacement material 220 may comprise a single Ge/SiGe or III-V material or a multilayer stack, as variously described herein. In addition, replacement material 220 may be strained and/or doped depending on the end use or target application.

Figure 2F:
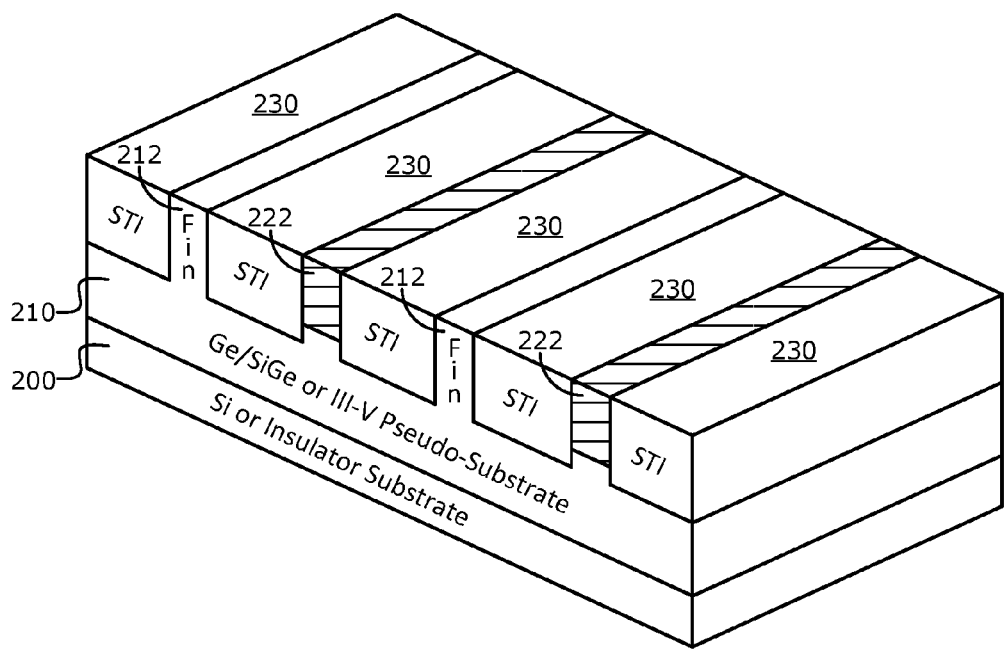

Method 100 continues with removing 112 hardmask 240 and planarizing/polishing replacement material 220, to form the resulting example structure shown in FIG. 2F, in accordance with an embodiment. Hardmask 240 may be removed using any suitable technique, and in some instances, hardmask 240 may be removed when planarizing the structure. A polishing process may be performed to, for example, recover surface smoothness; however, such a process need not be performed. As can be seen in FIG. 2F, replacement material 220 has been formed into fins 222 having STI material 230 on either side of each fin 222. Therefore, the structure has alternating fins of Ge/SiGe material and III-V material, since either fins 212 or 222 are Ge/SiGe material and the other of fins 212 or 222 are III-V material.

Figure 2G:
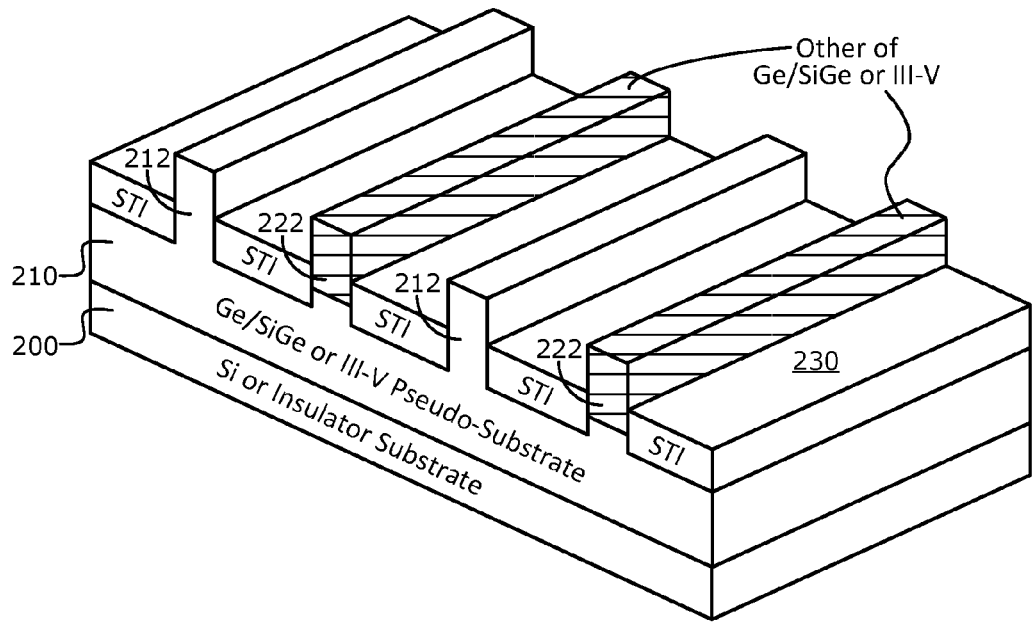

Method 100 continues with recessing 114 STI material 230 to allow fins 212 and 222 to exude above the STI plane, forming the resulting example structure shown in FIG. 2G, in accordance with an embodiment. Recessing 114 STI material 230 can be performed using any suitable technique and it may be beneficial for finned and nanowire transistor configurations, as will be apparent in light of this disclosure. However, in embodiments where planar transistor configurations are formed using method 100, recess process 114 may not be performed, and therefore recess process 114 is optional. In an alternative embodiment, the structure shown in FIG. 2G may be a view inside the replacement gate section where only the channel region or active portion of the pseudo-substrate fin 212 under a gate is replaced. Examples of such resulting structures, where only the channel region is replaced, are shown in FIGS. 3B, 4B, and 5B, as will be discussed in more detail herein. Such structures as shown in FIGS. 3B, 4B, and 5B can be compared to FIGS. 3A, 4A, and 5A, where the entire pseudo-substrate fin is replaced, for example. Note that in embodiments where the entire fin is replaced, the replacement can be performed before any gate processing is performed. Further note that in embodiments where only the active portion/channel region of the pseudo-substrate fin is replaced, the replacement can be performed during gate processing, when the dummy gate has been removed to expose the channel regions of the pseudo-substrate fins.

Figure 2H:
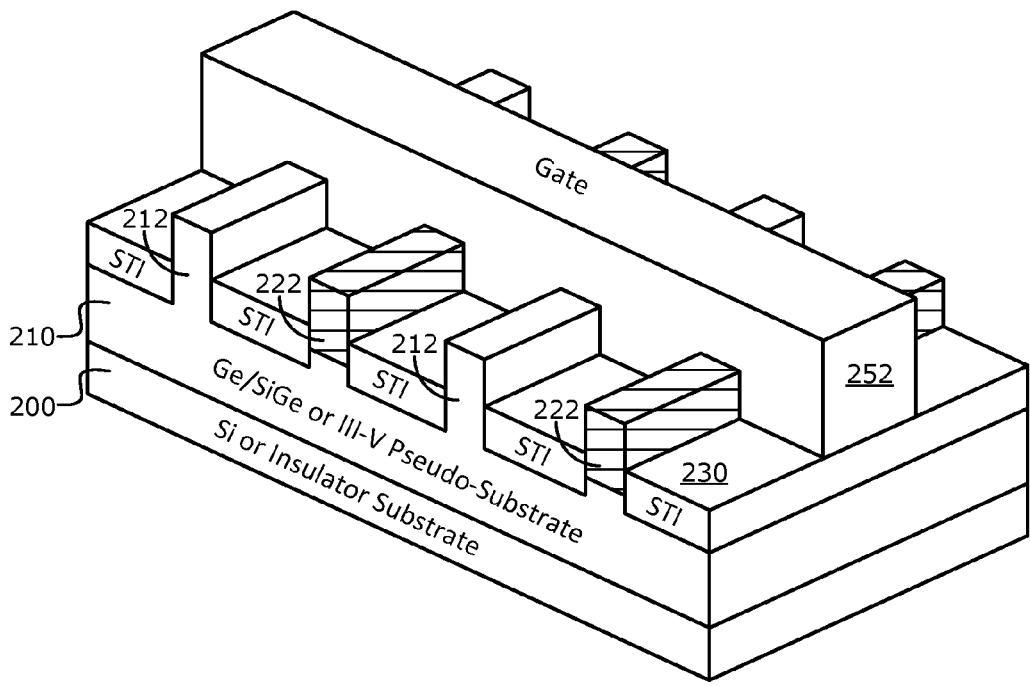

Method 100 continues with completing 116 the formation of one or more transistors. Various different processes can be performed to complete 116 the formation of one or more transistors, and such processes may include forming a gate or gate stack 250 on fins 212 and 222, as can be seen in FIG. 2H, in accordance with an embodiment. The formation of gate 250 may include dummy gate oxide deposition, dummy gate electrode (e.g., poly-Si) deposition, and patterning hardmask deposition. Additional processing may include patterning the dummy gates and depositing/etching spacer material. Following such processes, the method may continue with insulator deposition, planarization, and then dummy gate electrode and gate oxide removal to expose the channel region of the transistors, such as is done for a replacement metal gate process. Following opening the channel region, the dummy gate oxide and electrode may be replaced with, for example, a hi-k dielectric and a replacement metal gate, respectively. A source/drain contact trench processing loop may then be performed, which may include the deposition of source/drain metal contacts or contact layers, for example. Method 100 may include various suitable additional or alternative processes, as will be apparent in light of this disclosure.

Figure 3A:
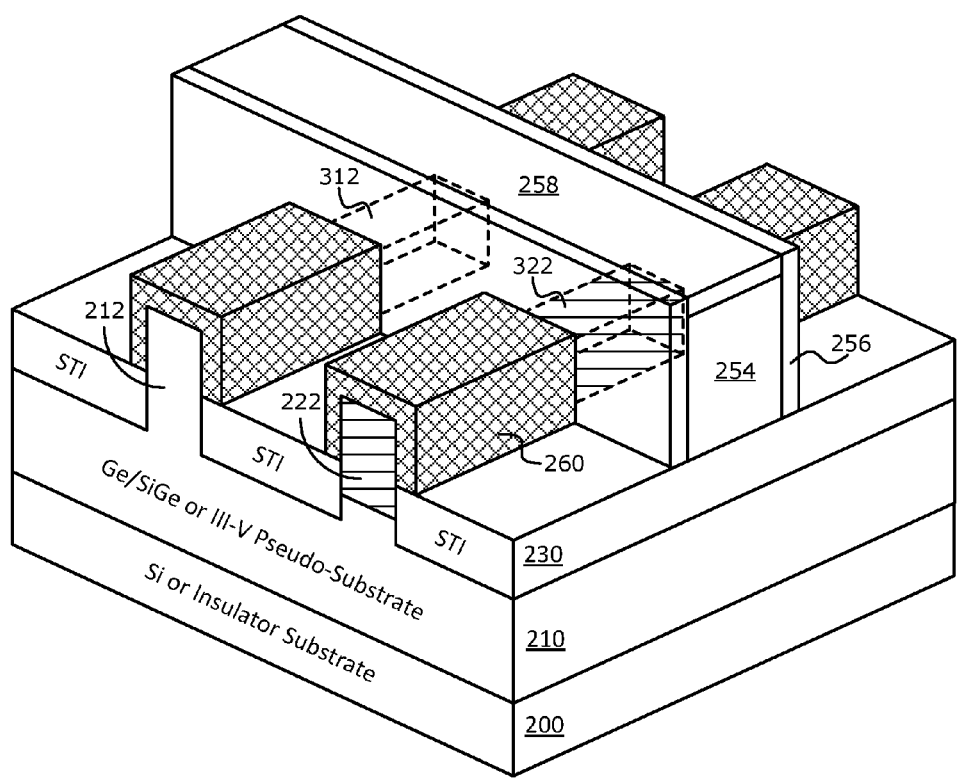
FIG. 3A illustrates an integrated circuit including two transistors having finned configurations, the first transistor comprising Ge/SiGe or III-V material and the second transistor comprising the other of Ge/SiGe or III-V material, in accordance with an embodiment.
Figure 3B:
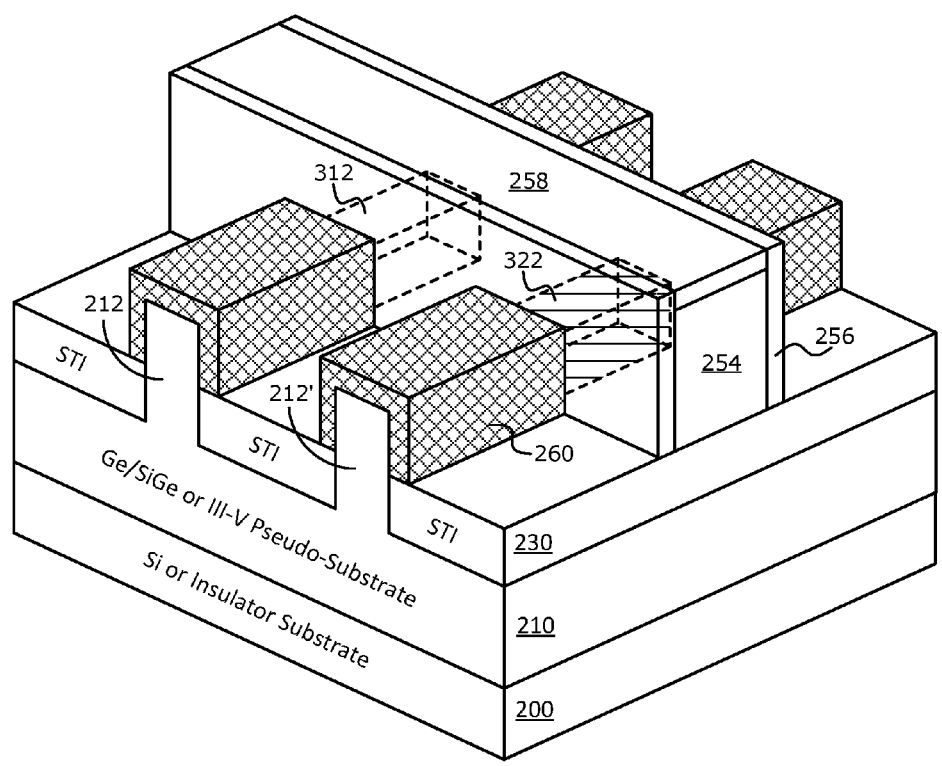
FIG. 3B illustrates an integrated circuit including two transistors having finned configurations, the first transistor comprising Ge/SiGe or III-V material and the second transistor including source/drain regions comprising the Ge/SiGe or III-V material and a channel region comprising the other of the Ge/SiGe or III-V material, in accordance with an embodiment.

FIG. 3A illustrates an integrated circuit including two transistors having finned configurations, the first transistor comprising Ge/SiGe or III-V material and the second transistor comprising the other of Ge/SiGe or III-V material, in accordance with an embodiment. As can be seen, the integrated circuit includes substrate 200, pseudo-substrate 210, fins 212 and 222, and STI 230 separating the fins, all of which have been previously described with reference to FIGS. 2A-H. The integrated circuit also includes gate electrode 254 and gate dielectric (not shown for ease of illustration) formed directly under gate electrode 254. Gate dielectric and gate electrode may be formed using any suitable technique and from any suitable materials. For example, the gate stack may have been formed during a replacement metal gate process, as previously described, and such a process may include any suitable deposition technique (e.g., CVD, PVD, etc.). Further, gate electrode may comprise a wide range of materials, such as polysilicon or various suitable metals or metal alloys, such as aluminum (Al), tungsten (W), titanium (Ti), or copper (Cu), for example. As can also be seen, spacers 256 and hardmask 258 are formed around the gate stack. Source/drain regions of fins 212 and 222 also include contacts 260, which may be formed after a source/drain contact trench etch was performed to expose those regions. Contacts 260 can be formed using, for example, a silicidation process (generally, deposition of contact metal and subsequent annealing).

As can be seen in FIG. 3A, the channel regions 312 and 322 of fins 212 and 222, respectively, match their respective fins in both shape and material. For example, if pseudo-substrate 210 comprises Ge/SiGe as variously described herein, then fin 212 formed from pseudo substrate 210 also comprises Ge/SiGe and channel region 312 of fin 212 also comprises Ge/SiGe. In such an example, fin 222, formed on pseudo-substrate 210, comprises III-V material and channel region 322 of fin 222 also comprises III-V material. Further, in such an example, Ge/SiGe channel region 312 may be p-type doped (e.g., to form a p-MOS transistor) and III-V channel region 322 may be n-type doped (e.g., to form an n-MOS transistor). In another example, if pseudo-substrate 210 comprises III-V material as variously described herein, then fin 212 formed from pseudo substrate 210 also comprises III-V material and channel region 312 of fin 212 also comprises III-V material. In such an example, fin 222, formed on pseudo-substrate 210, comprises Ge/SiGe and channel region 322 of fin 222 also comprises Ge/SiGe. Further, in such an example, III-V channel region 312 may be n-type doped (e.g., to form an n-MOS transistor) and Ge/SiGe channel region 322 may be p-type doped (e.g., to form a p-MOS transistor). Doping, as variously described herein, may be performed using any suitable techniques and dopants, depending, for example, upon the material being doped, the desired n-type or p-type doping result, and/or the target application. For instance, p-type dopants for Ge/SiGe may include boron (B), aluminum (Al), gallium (Ga), and/or indium (In), just to name a few examples. In addition, n-type dopants for III-V material may include carbon (C), silicon (Si), germanium (Ge), tin (Sn), selenium (Se), and/or tellurium (Te), just to name a few examples. Numerous different doping schemes will be apparent in light of the present disclosure.

FIG. 3B illustrates an integrated circuit including two transistors having finned configurations, the first transistor comprising Ge/SiGe or III-V material and the second transistor including source/drain regions comprising the Ge/SiGe or III-V material and a channel region comprising the other of the Ge/SiGe or III-V material, in accordance with an embodiment. In this example embodiment, the replacement of pseudo-substrate material 210 was performed during a replacement metal gate process, such that only the channel region of fin 212' was replaced. This may have been achieved by maintaining fins 212 in FIG. 2B intact, performing a recess of STI 240 (e.g., as described with reference to FIG. 2G), and then replacing only the active portion or channel region of a subset of the pseudo-substrate fins while the channel region is exposed (e.g., during replacement metal gate processing). In such a case, only a subset of the channel regions of fins 212 may be replaced to form fins 212' including replacement channel region 322 as shown in FIG. 3B. Further, in such an example case and as previously described, FIG. 2G may represent the exposed channel region inside of a gate electrode trench after only the channel regions of a subset of the pseudo-substrate fins were replaced. Note that in the example embodiment shown in FIG. 3B, the source/drain regions of the transistors comprise the same material (one of Ge/SiGe or III-V material) while the channel regions comprise different material (where one comprises the Ge/SiGe or III-V material and the other comprises the other of Ge/SiGe or III-V material).

Figure 4A:
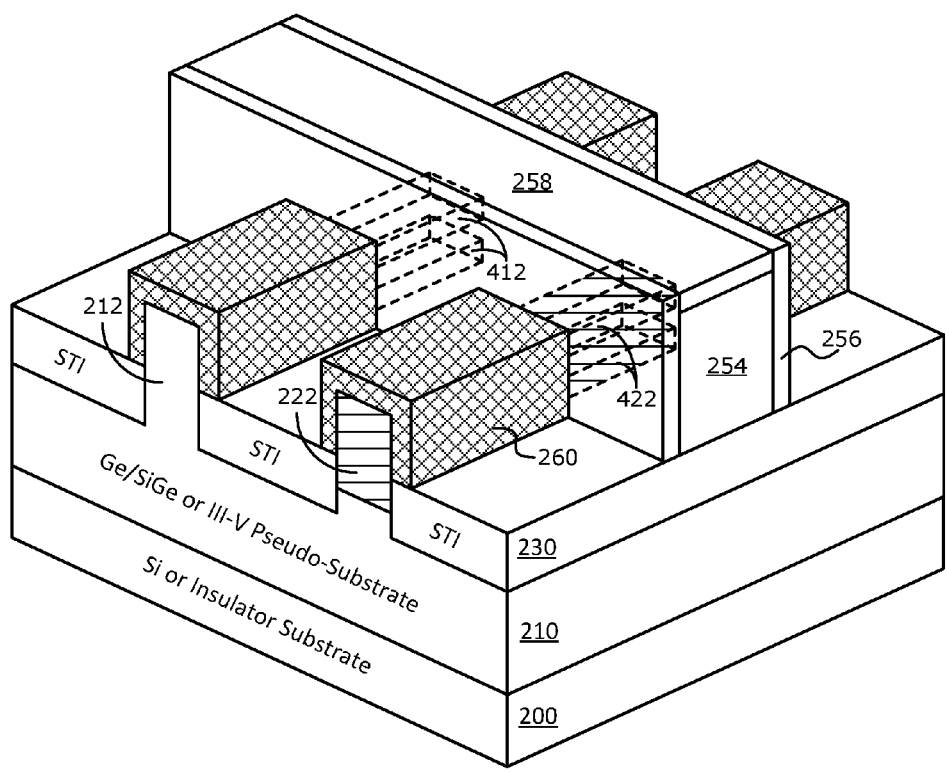
FIG. 4A illustrates an integrated circuit similar to the one illustrated in FIG. 3A, except that the transistors have nanowire configurations, in accordance with an embodiment.
Figure 4B:
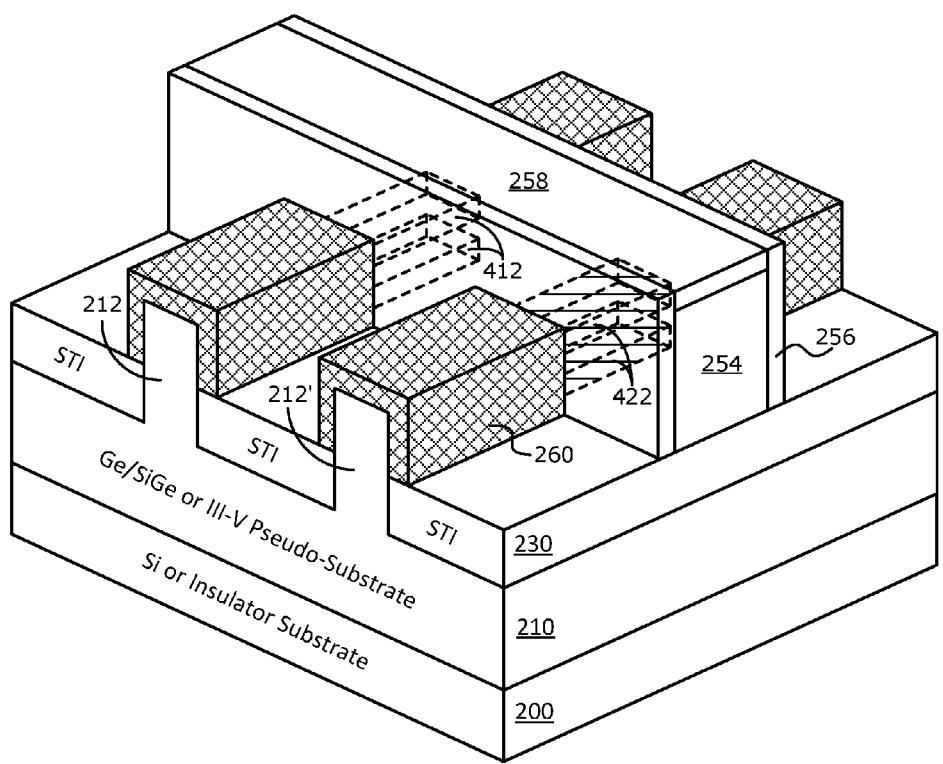
FIG. 4B illustrates an integrated circuit similar to the one illustrated in FIG. 3B, except that the transistors have nanowire configurations, in accordance with an embodiment.

FIG. 4A illustrates an integrated circuit similar to the one illustrated in FIG. 3A, except that the transistors have nanowire configurations, in accordance with an embodiment. A nanowire transistor (sometimes referred to as gate-all-around or nanoribbon) is configured similarly to a fin-based transistor, but instead of a finned channel region where the gate is on three sides (and therefore, there are three effective gates), one or more nanowires are used and the gate material generally surrounds the nanowires on all sides. Depending on the particular design, some nanowire transistors have, for instance, four effective gates. As can be seen in FIG. 4A, the transistors each have nanowire channel architecture 412 and 422 with each having two nanowires, although other embodiments can have any number of nanowires. The nanowires 412 and 422 may have been formed while the channel regions were exposed during a replacement metal gate process after the dummy gate is removed, for example. In such an example, the Ge/SiGe and/or III-V material fins may be multilayer structures to help facilitate the transformation from a finned structure to a nanowire structure. In an example case, a III-V multilayer stack may be formed, such as GaAs/InGaAs or InP/InGaAs, where the GaAs or InP layers are etched away to form an InGaAs nanowire. However, numerous different materials and techniques can be used to form Ge/SiGe or III-V material nanowire channel architecture, as will be apparent in light of this disclosure.

FIG. 4B illustrates an integrated circuit similar to the one illustrated in FIG. 3B, except that the transistors have nanowire configurations, in accordance with an embodiment. Note that in this example embodiment, the source/drain regions of the transistors comprise the same material (one of Ge/SiGe or III-V material) while the channel regions comprise different material (where one comprises the Ge/SiGe or III-V material and the other comprises the other of Ge/SiGe or III-V material).

Figure 5A:
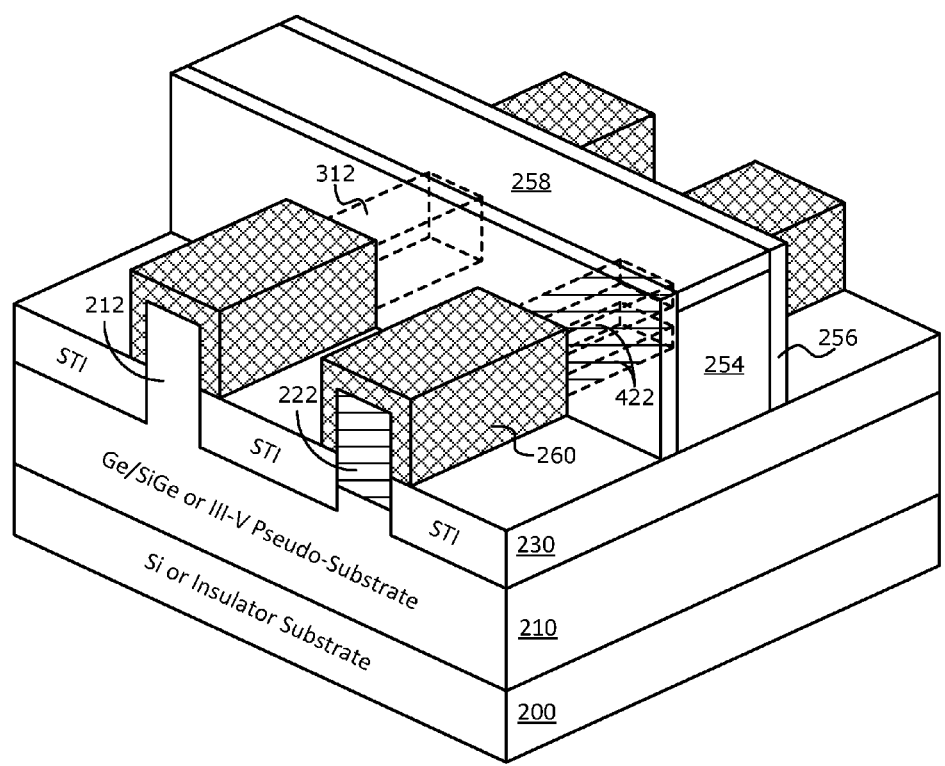
FIGS. 5A-B illustrate integrated circuits similar to the ones illustrated in FIGS. 3A-B, respectively, except that one of the transistors has a finned configuration and the other has a nanowire configuration, in accordance with some embodiments.
Figure 5B:
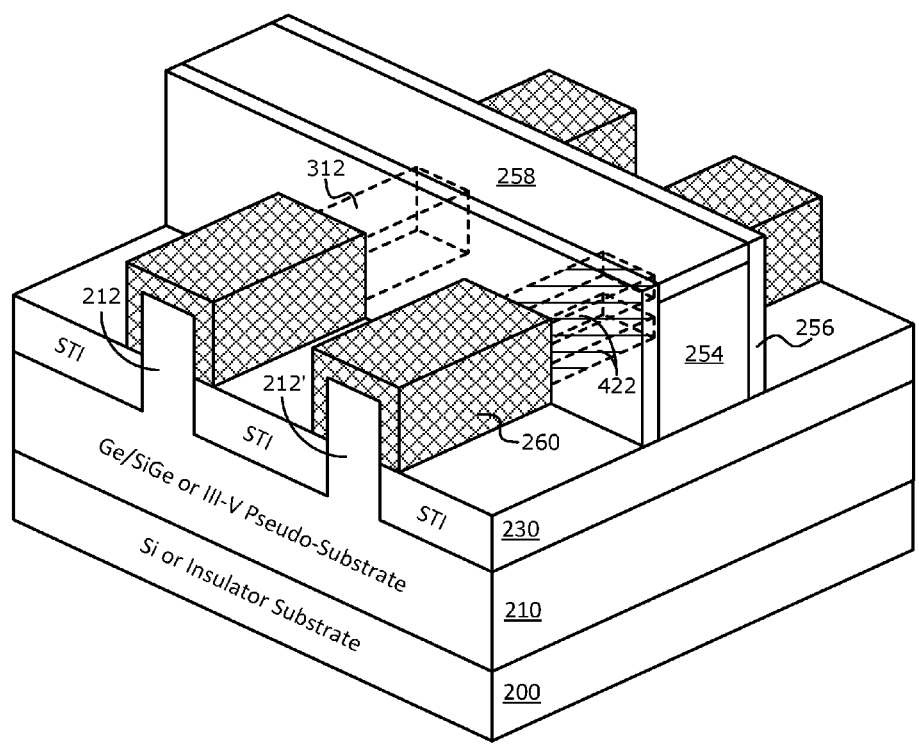

FIGS. 5A-B illustrate integrated circuits similar to the ones illustrated in FIGS. 3A-B, respectively, except that one of the transistors has a finned configuration and the other has a nanowire configuration, in accordance with some embodiments. The embodiments in FIGS. 5A-B illustrate that different transistor configurations may be formed on the same integrated circuit. In these example embodiments, the integrated circuits include finned channel region 312, which is comprised of the same material as pseudo-substrate 210, and nanowire channel region 422, which is comprised of a material different from pseudo-substrate material 210. These embodiments are provided as two different configurations; however, any number of configurations may be formed, including integrated circuits with planar, dual-gate, finned, and/or nanowire transistor configurations. In any of the embodiments shown in FIGS. 3A-B, 4A-B, and 5A-B (or any other suitable configuration, as will be apparent in light of this disclosure) the two transistors may form a CMOS device.

Example System

Figure 6:
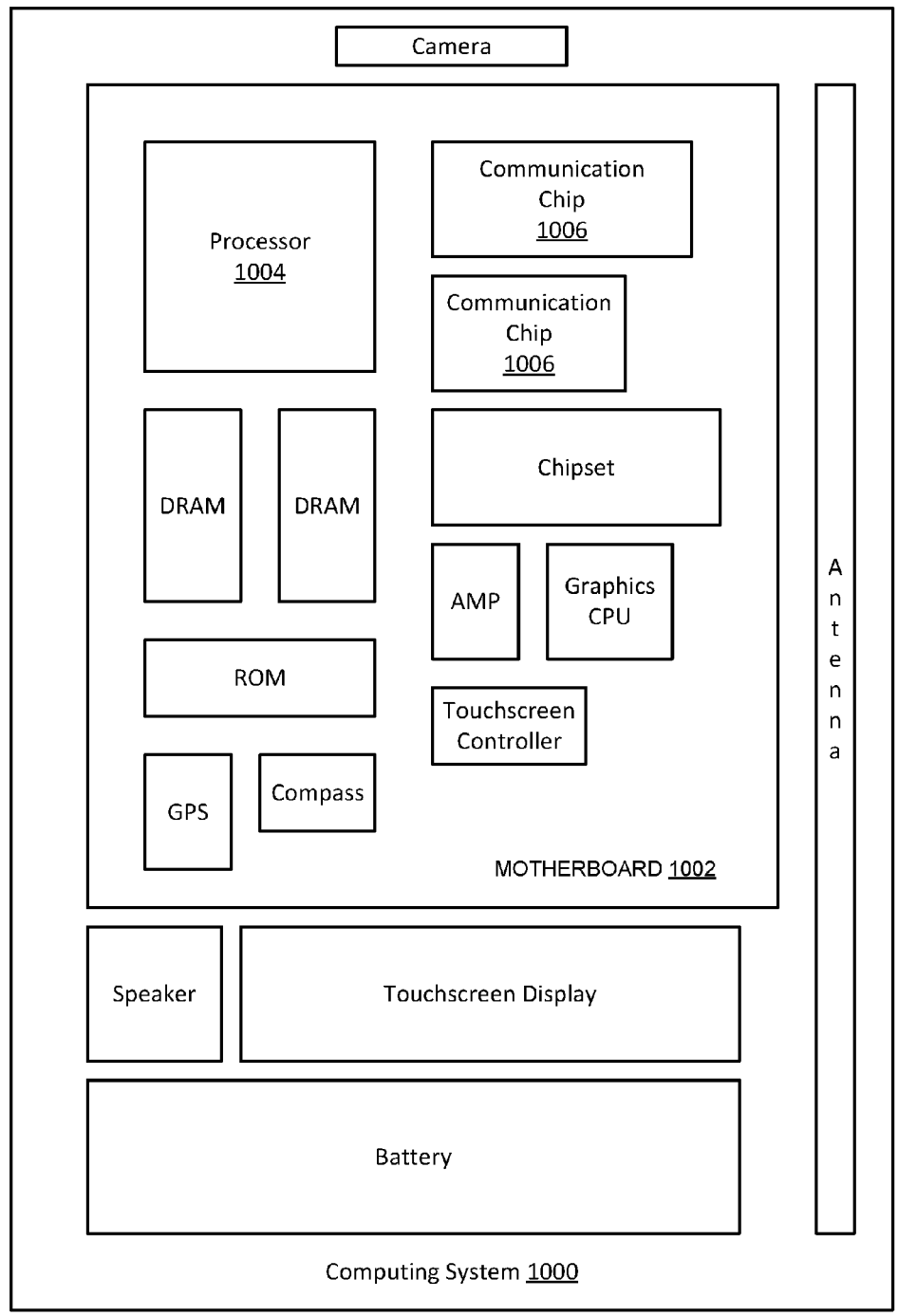
FIG. 6 illustrates a computing system implemented with integrated circuit structures or devices formed using the techniques disclosed herein, in accordance with an example embodiment.

FIG. 6 illustrates a computing system 1000 implemented with integrated circuit structures or devices formed using the techniques disclosed herein, in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit comprising: a silicon (Si) or insulator substrate; a pseudo-substrate formed on the substrate and comprising one of: germanium (Ge) and/or silicon germanium (SiGe); or at least one III-V material; a first transistor including a channel region, the first transistor channel region formed from a portion of the pseudo-substrate and comprising the pseudo-substrate material; and a second transistor including a channel region, the second transistor channel region formed on the pseudo-substrate and comprising the other of: Ge and/or SiGe; or at least one III-V material.

Example 2 includes the subject matter of Examples 1, wherein the pseudo-substrate is blanket deposited on the substrate.

Example 3 includes the subject matter of any of Examples 1-2, wherein the Ge and/or SiGe channel region is p-type doped and the III-V channel region is n-type doped.

Example 4 includes the subject matter of any of Examples 1-3, wherein the transistor having a Ge and/or SiGe channel region consists of $Si_{1-x}Ge_x$ where x>0.8 or 0.4>x>0.2.

Example 5 includes the subject matter of any of Examples 1-4, wherein the second transistor includes source/drain regions formed on the substrate and comprising the second transistor channel region material.

Example 6 includes the subject matter of any of Examples 1-4, wherein the second transistor includes source/drain regions formed from a portion of the pseudo-substrate and comprising the pseudo-substrate material.

Example 7 includes the subject matter of any of Examples 1-6, wherein the at least one III-V material comprises a stack of at least two III-V materials.

Example 8 includes the subject matter of Examples 7, wherein the bottom material in the stack is one of gallium arsenide (GaAs), indium phosphide (InP), aluminum arsenide (AlAs), and indium aluminum arsenide (InAlAs).

Example 9 includes the subject matter of any of Examples 7-8, wherein the top material in the stack is one of indium gallium arsenide (InGaAs) and indium arsenide (InAs).

Example 10 includes the subject matter of any of Examples 1-9, wherein the at least one III-V material is p-type doped near the bottom and n-type doped near the top.

Example 11 includes the subject matter of any of Examples 1-10, wherein at least one of the first and second transistors has a finned configuration.

Example 12 includes the subject matter of any of Examples 1-11, wherein at least one of the first and second transistors has a nanowire or nanoribbon configuration.

Example 13 is a complementary metal-oxide-semiconductor (CMOS) device comprising the subject matter of any of Examples 1-12.

Example 14 is a computing system comprising the subject matter of any of Examples 1-12.

Example 15 is an integrated circuit comprising: a silicon (Si) or insulator substrate; a pseudo-substrate formed on the substrate and comprising one of: germanium (Ge) and/or silicon germanium (SiGe); or at least one III-V material; a first fin formed from the pseudo-substrate; and a second fin formed on the pseudo-substrate and comprising the other of: Ge and/or SiGe; or at least one III-V material.

Example 16 includes the subject matter of Examples 15, further comprising: a first transistor formed on the first fin; and a second transistor formed on the second fin.

Example 17 includes the subject matter of Examples 15, further comprising: a first transistor including a channel region formed from the first fin; and a second transistor including a channel region formed from the second fin.

Example 18 includes the subject matter of any of Examples 16-17, wherein the first transistor is a p-MOS transistor and the second transistor is an n-MOS transistor.

Example 19 includes the subject matter of any of Examples 16-18, wherein at least a portion of one of the first and second fins is formed into one or more nanowires or nanoribbons.

Example 20 includes the subject matter of any of Examples 15-19, wherein the pseudo-substrate is blanket deposited on the substrate.

Example 21 includes the subject matter of any of Examples 15-20, wherein the fin comprising Ge and/or SiGe consists of $Si_{1-x}Ge_x$ where x>0.8 or 0.4>x>0.2.

Example 22 includes the subject matter of any of Examples 15-21, wherein the at least one III-V material comprises a stack of at least two III-V materials.

Example 23 includes the subject matter of Examples 22, wherein the bottom material in the stack is one of gallium arsenide (GaAs), indium phosphide (InP), aluminum arsenide (AlAs), and indium aluminum arsenide (InAlAs).

Example 24 includes the subject matter of any of Examples 22-23, wherein the top material in the stack is one of indium gallium arsenide (InGaAs) and indium arsenide (InAs).

Example 25 includes the subject matter of any of Examples 15-24, wherein the at least one III-V material is p-type doped near the bottom and n-type doped near the top.

Example 26 is a method of forming an integrated circuit, the method comprising: blanket depositing a pseudo-substrate on a silicon (Si) or insulator substrate, the pseudo-substrate comprising one of: germanium (Ge) and/or silicon germanium (SiGe); or at least one III-V material; patterning the pseudo-substrate into a plurality of fins; and replacing at least a portion of each fin within a subset of the plurality of fins with a replacement material comprising the other of: Ge and/or SiGe; or at least one III-V material.

Example 27 includes the subject matter of Examples 26, further comprising: forming a first set of one or more transistors on the fins formed of the pseudo-substrate material; forming a second set of one or more transistors on the subset of fins that were replaced.

Example 28 includes the subject matter of any of Examples 26-27, wherein patterning the pseudo-substrate into a plurality of fins comprises: etching shallow trench isolation (STI) trenches; filling the STI trenches with STI oxide; and performing a planarize and/or polish process.

Example 29 includes the subject matter of any of Examples 26-28, wherein replacing at least a portion of the subset of the plurality of fins comprises: patterning hardmask on all fins outside of the subset; etching the subset; and depositing the replacement material.

Example 30 includes the subject matter of Examples 29, wherein replacing the subset of the plurality of fins further comprises: removing the hardmask; and performing a planarize and/or polish process.

Example 31 includes the subject matter of any of Examples 26-30, wherein the blanket deposition comprises a graded or multilayer deposition.

Example 32 includes the subject matter of any of Examples 26-31, wherein only a portion of each fin within the subset of the plurality of fins are replaced, the portions consisting of channel regions for subsequently formed transistors.

Example 33 includes the subject matter of any of Examples 26-32, further comprising forming at least a portion of each fin into one or more nanowires.

Example 34 includes the subject matter of any of Examples 26-32, further comprising replacing at least a portion of each fin with one or more nanowires.

Example 35 includes the subject matter of any of Examples 26-32, further comprising: forming one or more finned transistors on one of the subset of fins or the fins outside of the subset; and forming one or more nanowire transistors on the other of the subset of fins or the fins outside of the subset.

Example 36 includes the subject matter of any of Examples 26-35, further comprising: forming one or more p-MOS transistors on one of the subset of fins or the fins outside of the subset; and forming one or more n-MOS transistors on the other of the subset of fins or the fins outside of the subset.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising:
   a silicon (Si) or insulator substrate;
   a pseudo-substrate on the substrate and comprising one of:
     germanium (Ge) and/or silicon germanium (SiGe); or
     at least one III-V material;
   a first transistor including a channel region, the first transistor channel region in a portion of the pseudo-substrate and comprising the pseudo-substrate material; and
   a second transistor including a channel region, the second transistor channel region completely above the pseudo-substrate and comprising the other of:
     Ge and/or SiGe; or
     at least one III-V material.

2. The integrated circuit of claim 1, wherein the pseudo-substrate is on the entirety of a top surface of the substrate.

3. The integrated circuit of claim 1, wherein the Ge and/or SiGe channel region includes p-type dopant and the III-V channel region includes n-type dopant.

4. The integrated circuit of claim 1, wherein the transistor having a Ge and/or SiGe channel region consists of $Si_{1-x}Ge_x$ where x>0.8 or 0.4>x>0.2.

5. The integrated circuit of claim 1, wherein the second transistor includes source/drain regions on the substrate and comprising the second transistor channel region material.

6. The integrated circuit of claim 1, wherein the second transistor includes source/drain regions that are a portion of the pseudo-substrate and comprising the pseudo-substrate material.

7. The integrated circuit of claim 1, wherein the at least one III-V material comprises a stack of at least two III-V materials.

8. The integrated circuit of claim 7, wherein a bottom material in the stack is one of gallium arsenide (GaAs), indium phosphide (InP), aluminum arsenide (AlAs), or indium aluminum arsenide (InAlAs).

9. The integrated circuit of claim 7, wherein a top material in the stack is one of indium gallium arsenide (InGaAs) or indium arsenide (InAs).

10. The integrated circuit of claim 1, wherein the at least one III-V material includes p-type dopant near a bottom portion and n-type dopant near a top portion.

11. The integrated circuit of claim 1, wherein at least one of the first or second transistors has a finned configuration.

12. The integrated circuit of claim 1, wherein at least one of the first or second transistors has a nanowire or nanoribbon configuration.

13. A complementary metal-oxide-semiconductor (CMOS) device comprising the integrated circuit of any of claim 1.

14. A computing system comprising the integrated circuit of claim 1.

15. An integrated circuit comprising:
    a silicon (Si) or insulator substrate;
    a pseudo-substrate on the substrate and comprising one of:
      germanium (Ge) and/or silicon germanium (SiGe); or
      at least one III-V material;
    a first fin that is part of the pseudo-substrate; and
    a second fin that is on and interfaces with the pseudo-substrate and comprising the other of:
      Ge and/or SiGe; or
      at least one III-V material.

16. The integrated circuit of claim 15, further comprising:
    a first transistor that includes at least part of the first fin; and
    a second transistor that includes at least part of the second fin.

17. The integrated circuit of claim 15, further comprising:
    a first transistor including a channel region included in the first fin; and
    a second transistor including a channel region included in the second fin.

18. The integrated circuit of any of claim 16, wherein the first transistor is a p-MOS transistor and the second transistor is an n-MOS transistor.

19. The integrated circuit of claim 16, wherein at least a portion of one of the first or second fins includes one or more nanowires or nanoribbons.

20. A method of forming an integrated circuit, the method comprising:
    blanket depositing a pseudo-substrate on a silicon (Si) or insulator substrate, the pseudo-substrate comprising one of:
      germanium (Ge) and/or silicon germanium (SiGe); or
      at least one III-V material;
    patterning the pseudo-substrate into a plurality of fins; and replacing at least a portion of each fin within a subset of the plurality of fins with a replacement material comprising the other of:
Ge and/or SiGe; or
at least one III-V material.

22. The method of claim 20, further comprising:
forming a first set of one or more transistors on the fins formed of the pseudo-substrate material; and
forming a second set of one or more transistors on the subset of fins that were replaced.

22. The method of claim 20, wherein only a portion of each fin within the subset of the plurality of fins are replaced, the portions consisting of channel regions for subsequently formed transistors.

23. The method of claim 20, further comprising forming at least a portion of each fin into one or more nanowires.

24. The method of claim 20, further comprising replacing at least a portion of each fin with one or more nanowires.

25. The method of claim 20, further comprising:
forming one or more finned transistors on one of the subset of fins or the fins outside of the subset; and
forming one or more nanowire transistors on the other of the subset of fins or the fins outside of the subset.

\* \* \* \* \*